(12) United States Patent
Kawada et al.

(10) Patent No.: US 10,101,150 B2
(45) Date of Patent: Oct. 16, 2018

(54) HEIGHT MEASUREMENT DEVICE AND CHARGED PARTICLE BEAM DEVICE

(71) Applicant: Hitachi High-Technologies Corporation, Minato-ku, Tokyo (JP)

(72) Inventors: Hiroki Kawada, Tokyo (JP); Muneyuki Fukuda, Tokyo (JP); Yoshinori Momonoi, Tokyo (JP); Shou Takami, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/533,489

(22) PCT Filed: Dec. 10, 2014

(86) PCT No.: PCT/JP2014/082610
§ 371 (c)(1),
(2) Date: Jun. 6, 2017

(87) PCT Pub. No.: WO2016/092641
PCT Pub. Date: Jun. 16, 2016

(65) Prior Publication Data
US 2017/0343340 A1    Nov. 30, 2017

(51) Int. Cl.
*H01J 37/00* (2006.01)
*G01B 15/02* (2006.01)
*H01J 37/317* (2006.01)

(52) U.S. Cl.
CPC ............ *G01B 15/02* (2013.01); *H01J 37/317* (2013.01); *G01B 2210/56* (2013.01)

(58) Field of Classification Search
CPC .... G01B 15/02; G01B 2210/56; H01J 37/317
(Continued)

(56) References Cited

U.S. PATENT DOCUMENTS 5,569,392 A * 10/1996 Miyoshi .................... G03F 1/26
156/345.24
7,482,586 B2    1/2009 Ishitani et al.
(Continued)

FOREIGN PATENT DOCUMENTS

JP    01-193685    *  3/1989
JP    1-193685 A    8/1989
(Continued)

OTHER PUBLICATIONS

International Search Report (PCT/ISA/210) issued in PCT Application No. PCT/JP2014/082610 dated Mar. 24, 2015 with English-language translation (four (4) pages).
(Continued)

*Primary Examiner* — Michael Maskell
(74) *Attorney, Agent, or Firm* — Crowell & Moring LLP

(57) ABSTRACT

The objective of the present invention is to provide a height measurement device capable of highly accurate measurement in the depth direction of a structure on a sample. To achieve this objective, proposed are a charged particle beam device and a height measurement device that is provided with a calculation device for determining the size of a structure on a sample on the basis of a detection signal obtained by irradiating the sample with a charged particle beam, wherein the calculation device calculates the distance from a first charged particle beam irradiation mark formed at a first height on the sample and a second charged particle beam irradiation mark formed at a second height on the sample and on the basis of this distance and the charged particle beam irradiation angle when the first charged particle beam irradiation mark and second charged particle beam irradiation mark were formed, calculates the distance between the first height and the second height.

11 Claims, 12 Drawing Sheets

(58) Field of Classification Search
   USPC .............................. 250/306, 307, 310, 311
   See application file for complete search history.

(56) References Cited

U.S. PATENT DOCUMENTS

| | | |
|---|---|---|
| 8,779,400 B2 | 7/2014 | Shichi et al. |
| 2010/0150429 A1 | 6/2010 | Jau et al. |
| 2012/0217392 A1 | 8/2012 | Murakawa et al. |

FOREIGN PATENT DOCUMENTS

| | | |
|---|---|---|
| JP | 7-94401 A | 4/1995 |
| JP | 7-191449 A | 7/1995 |
| JP | 7-297114 A | 11/1995 |
| JP | 9-257445 A | 10/1997 |
| JP | 2002-323311 A | 11/2002 |
| JP | 2005-235495 A | 9/2005 |
| JP | 2012-177654 A | 9/2012 |
| JP | 2013-120169 A | 6/2013 |
| JP | 2014-25815 A | 2/2014 |

OTHER PUBLICATIONS

Japanese-language Written Opinion (PCT/ISA/237) issued in PCT Application No. PCT/JP2014/082610 dated Mar. 24, 2015 (four (4) pages).
Taiwanese Office Action issued in counterpart Taiwanese Application No. 104140530 dated Nov. 17, 2016 (eight (8) pages).

* cited by examiner

[Fig. 1]
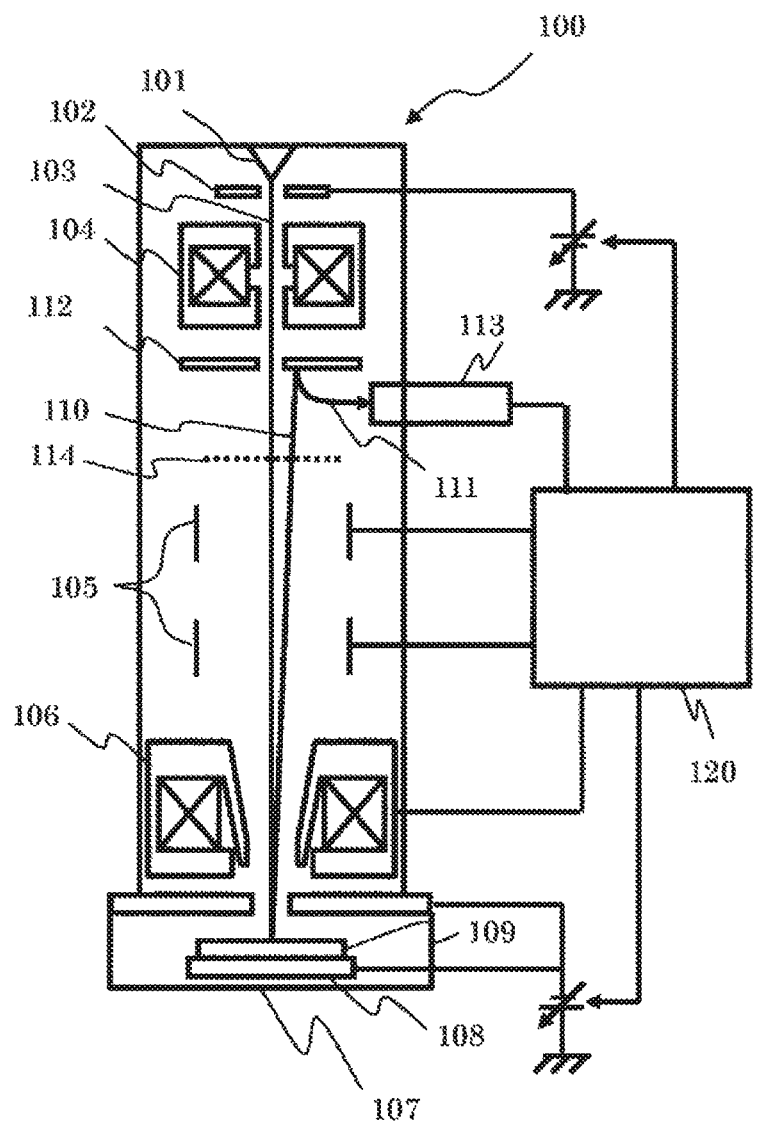

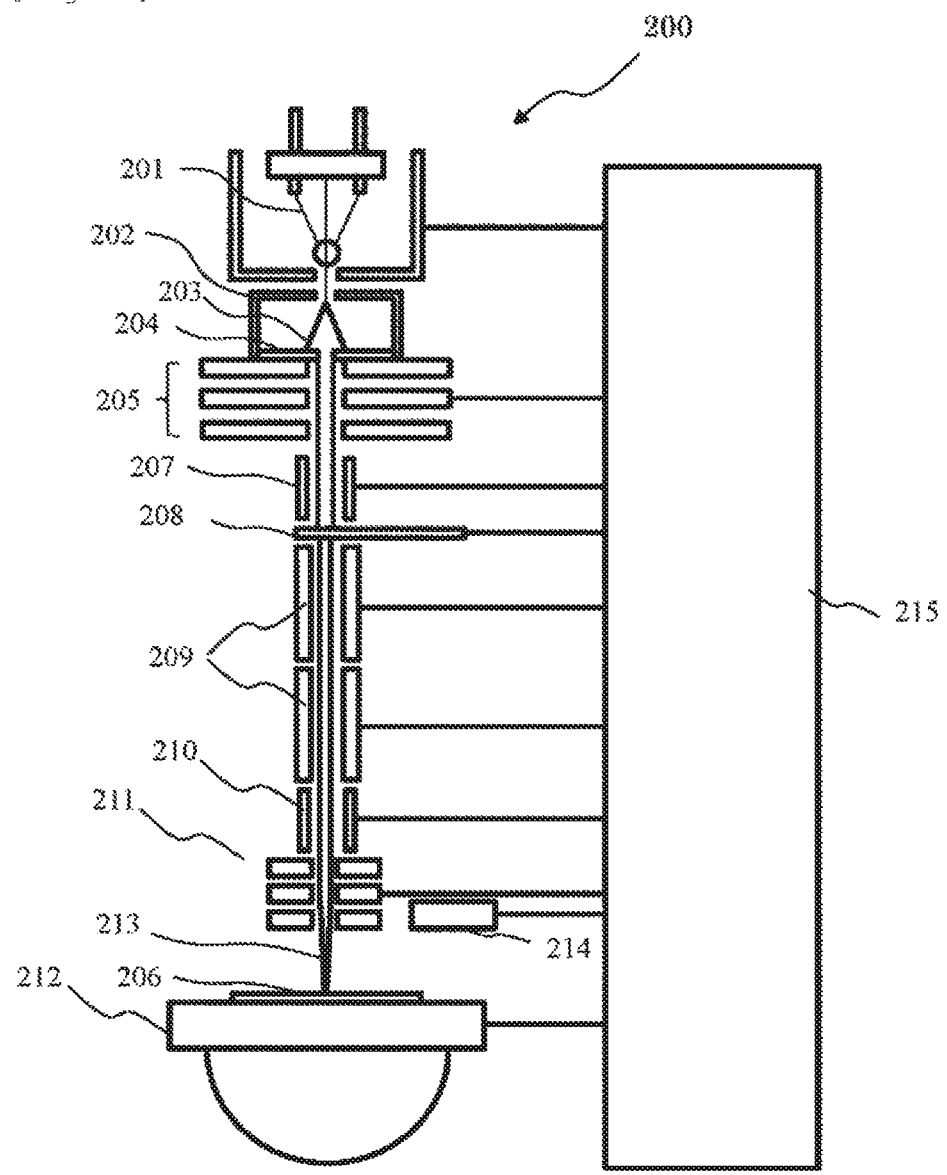
[Fig. 2]

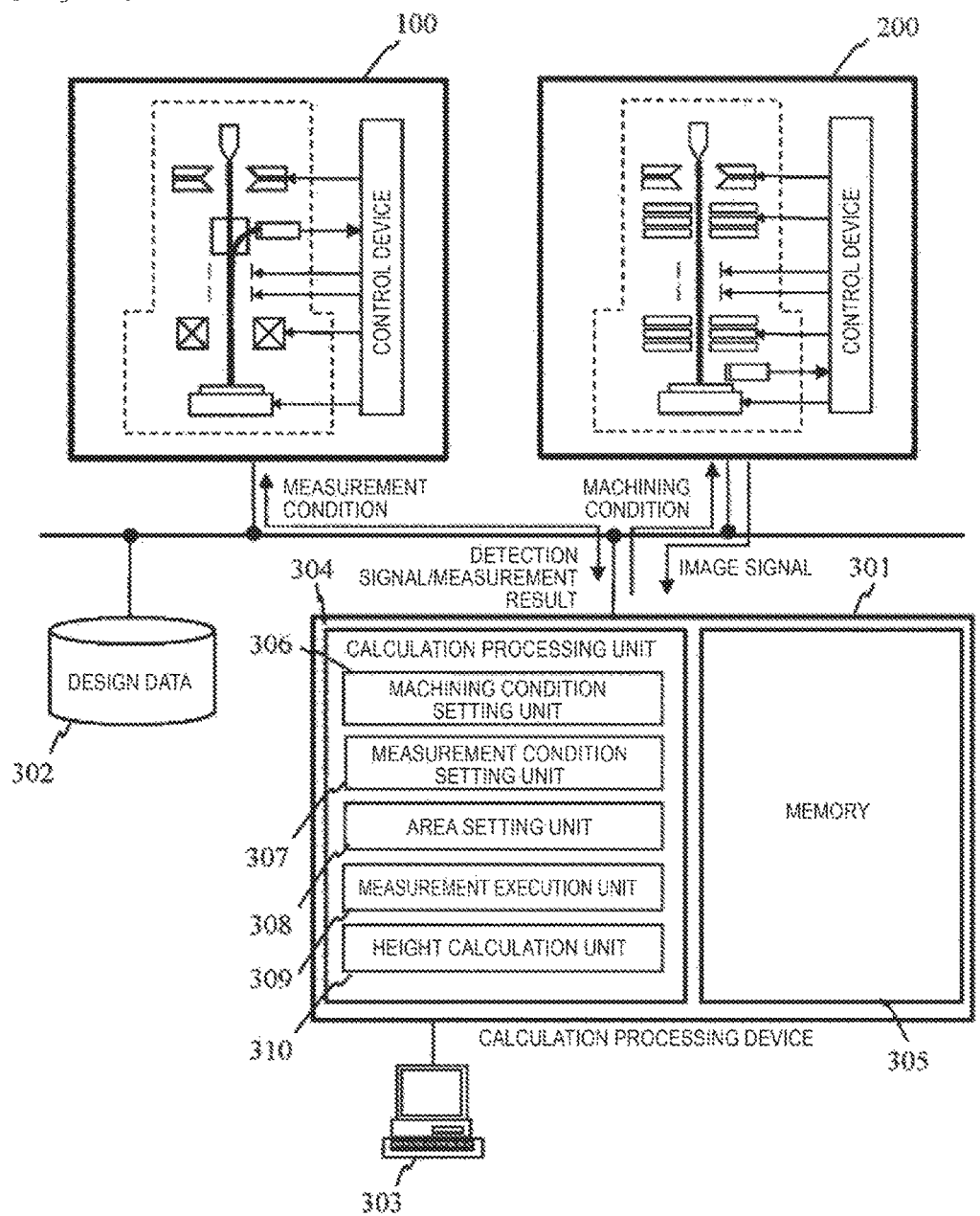

[Fig. 4]
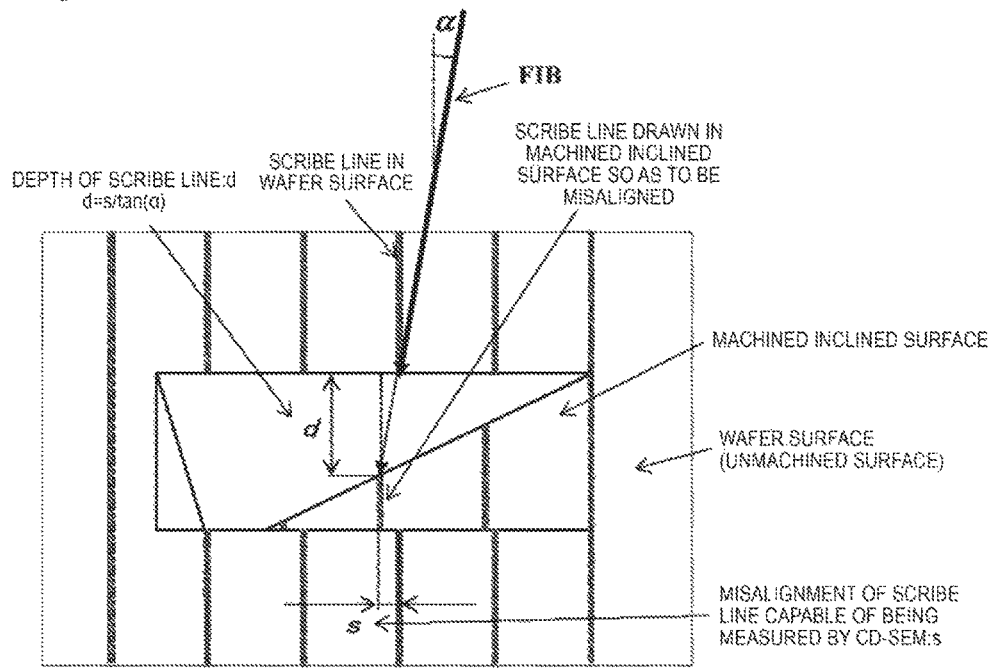
[Fig. 5]
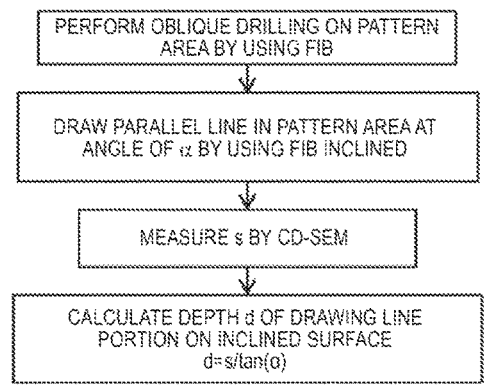

[Fig. 6]
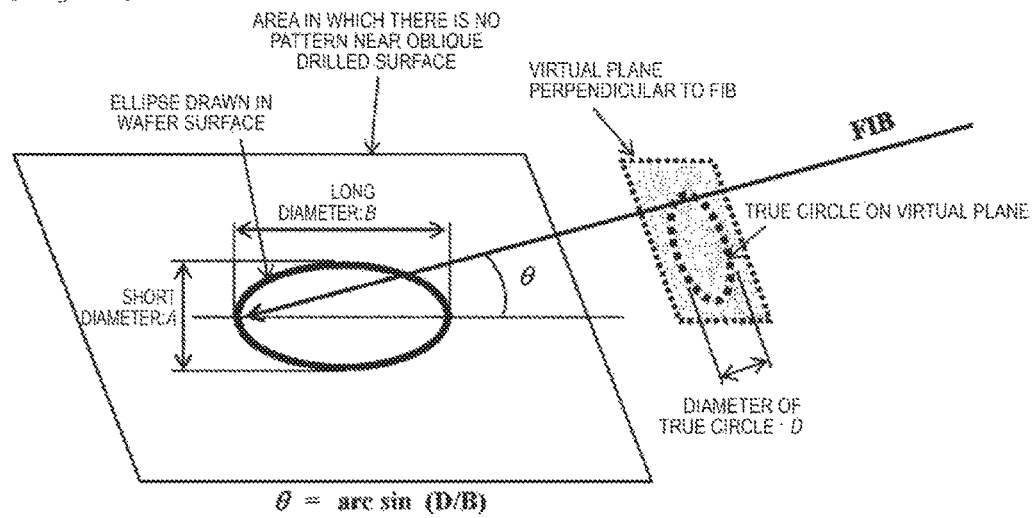
$\theta = \arcsin(D/B)$
[Fig. 7]
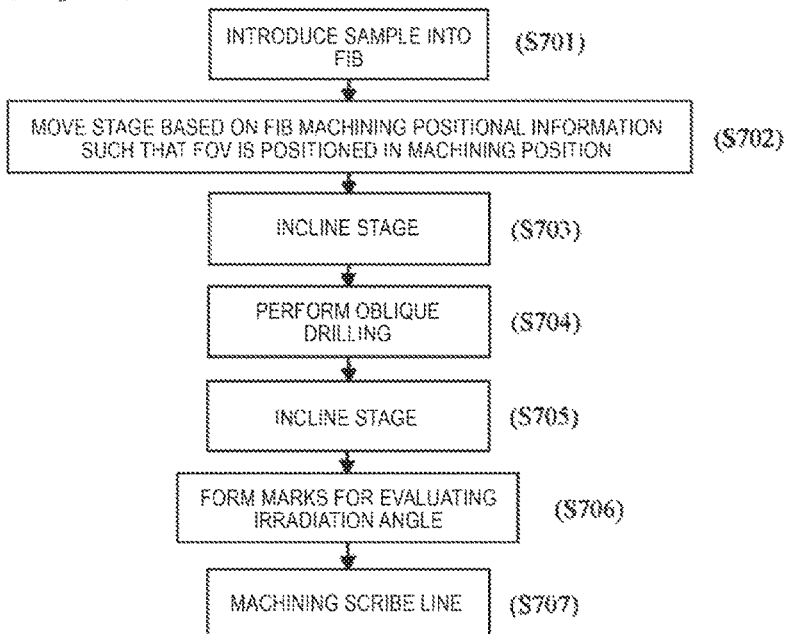

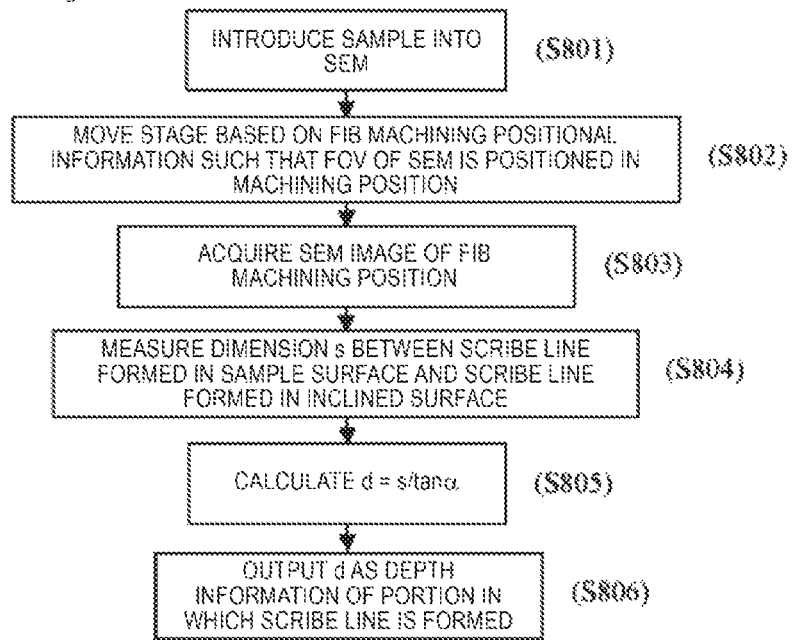
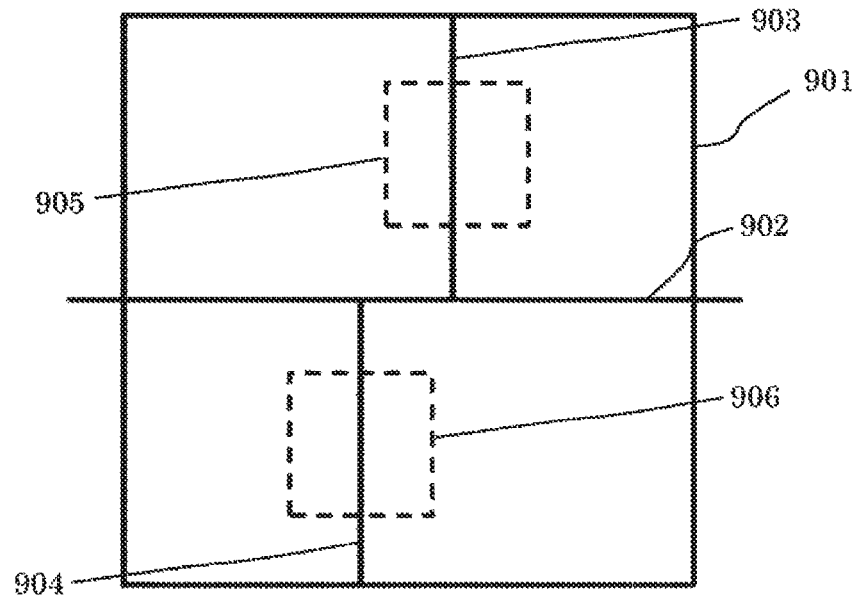

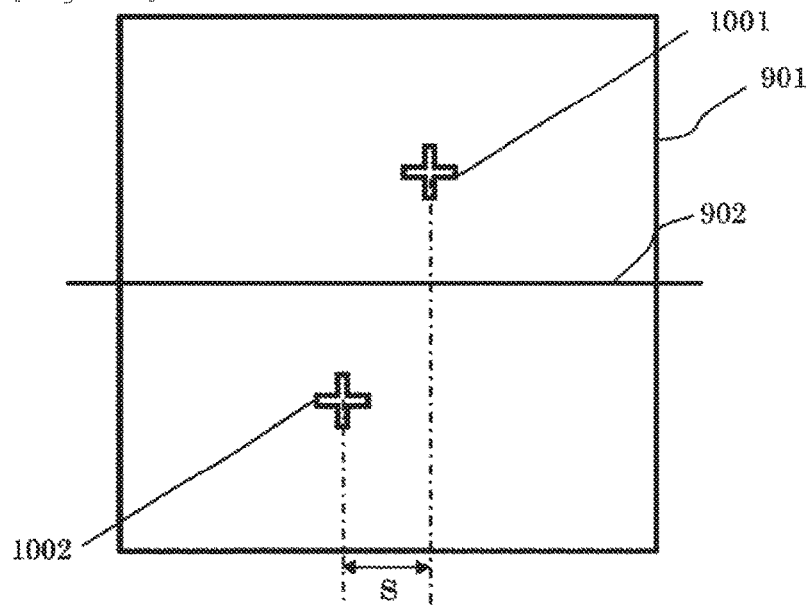
[Fig. 10]
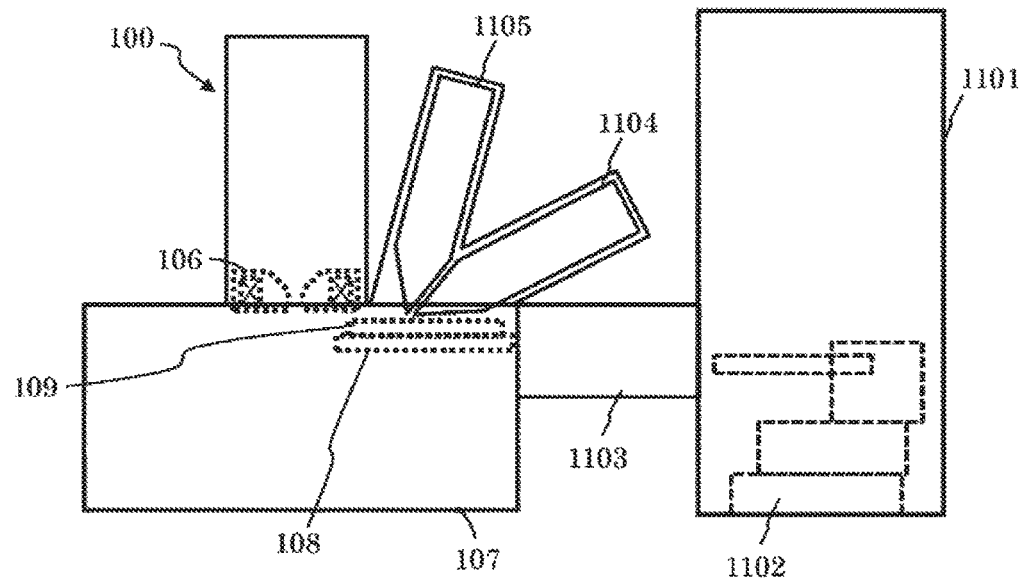
[Fig. 11]

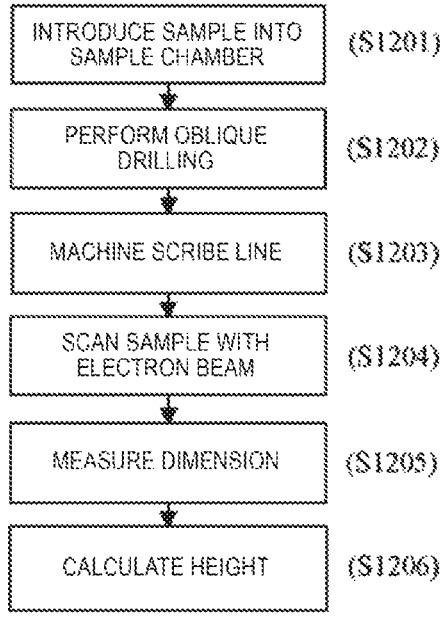
[Fig. 12]
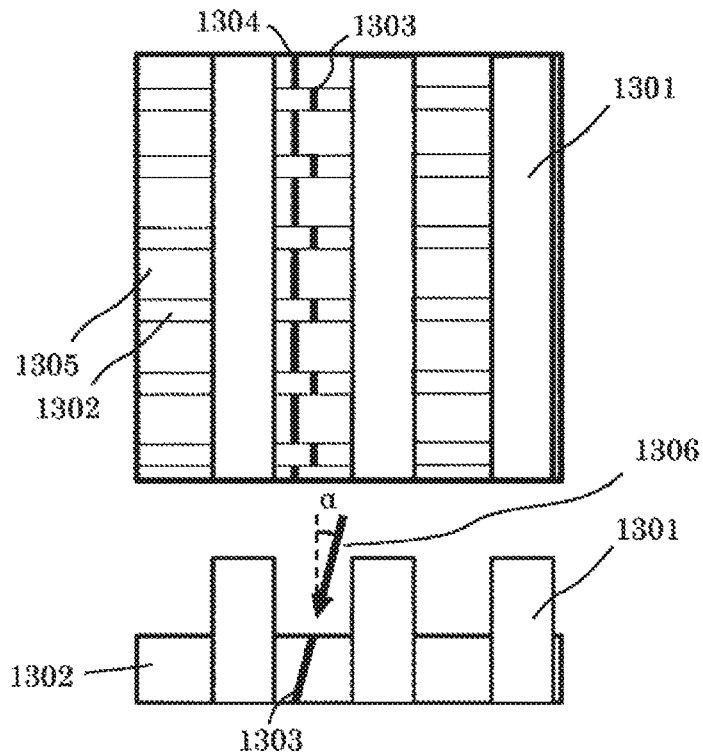
[Fig. 13]

[Fig. 14]
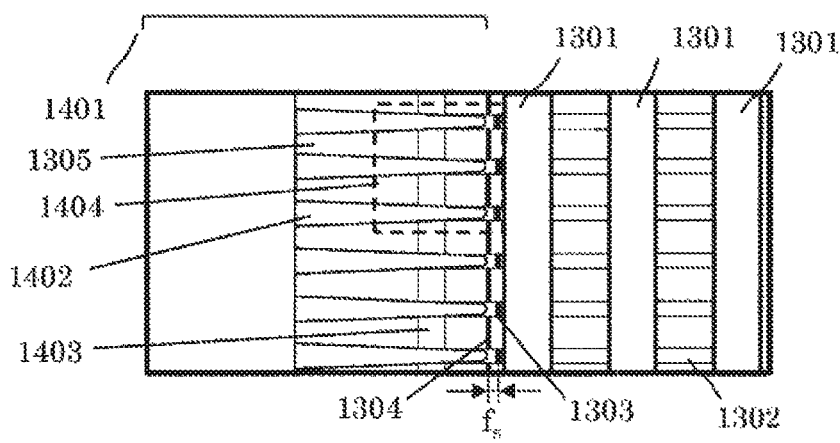
[Fig. 15]
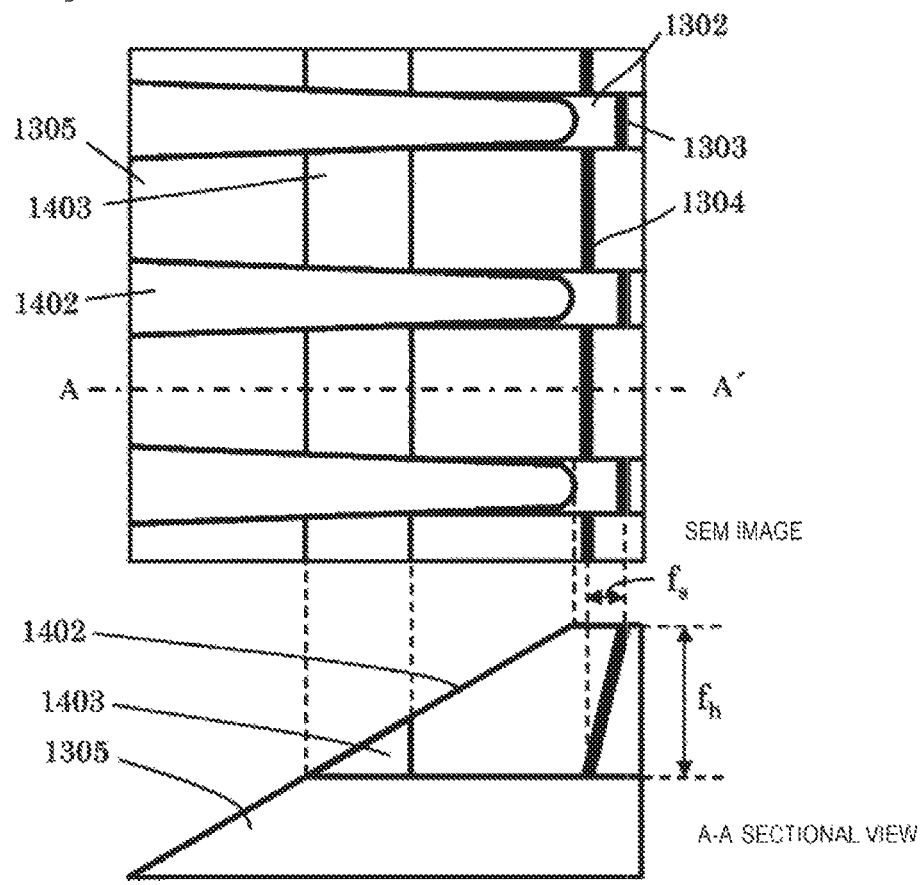

[Fig. 16]
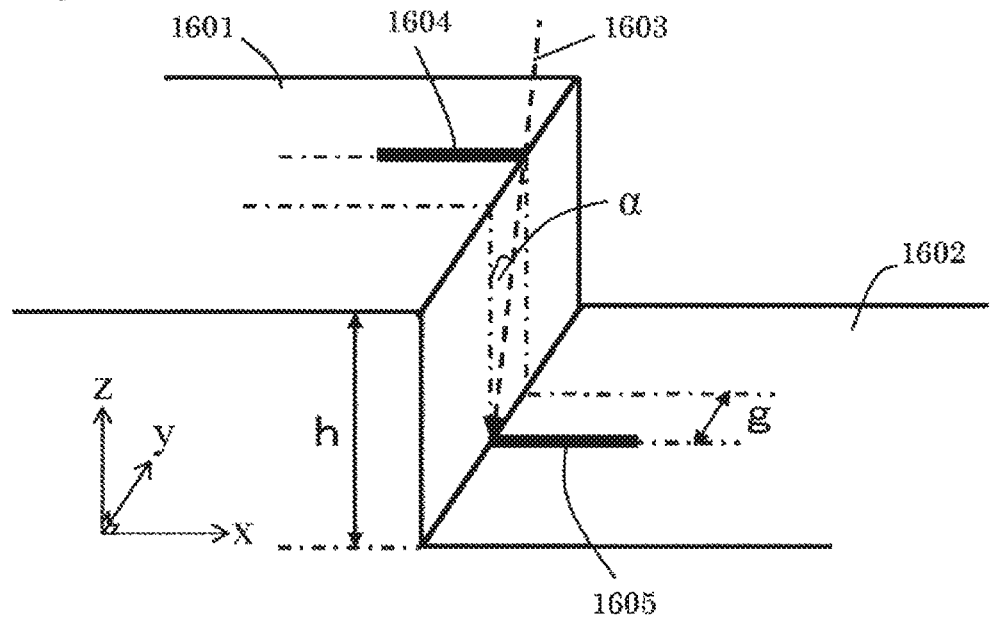
[Fig. 17]
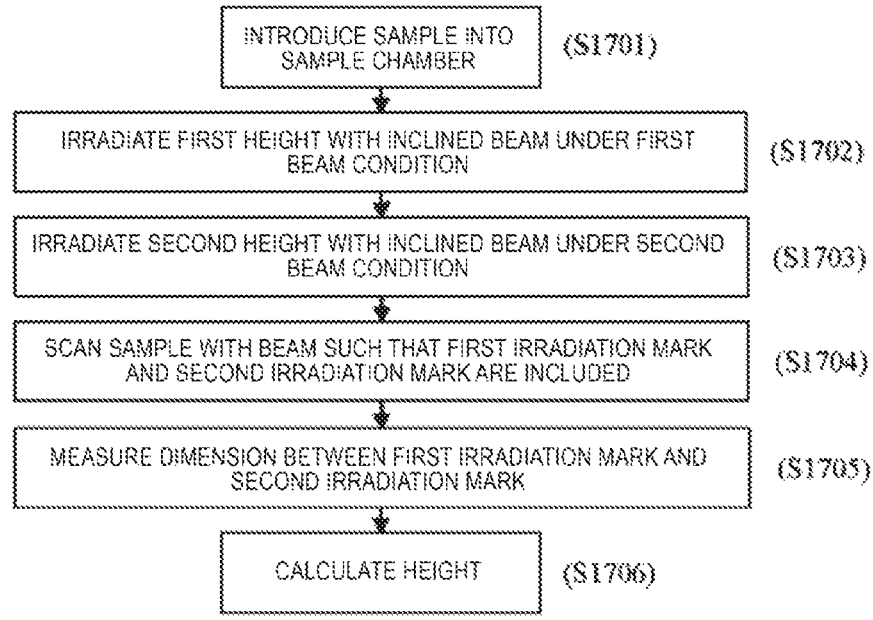

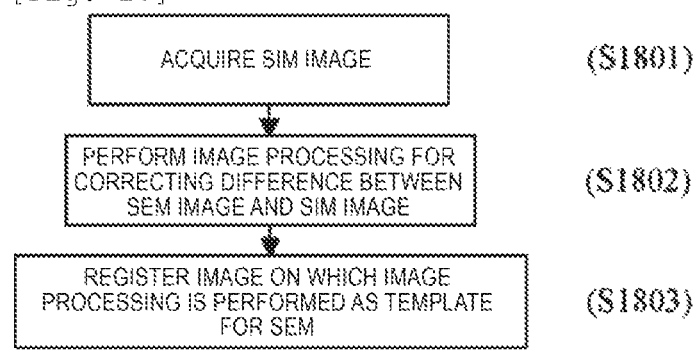
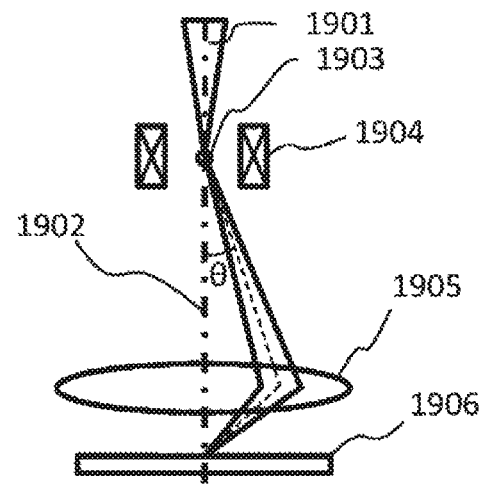
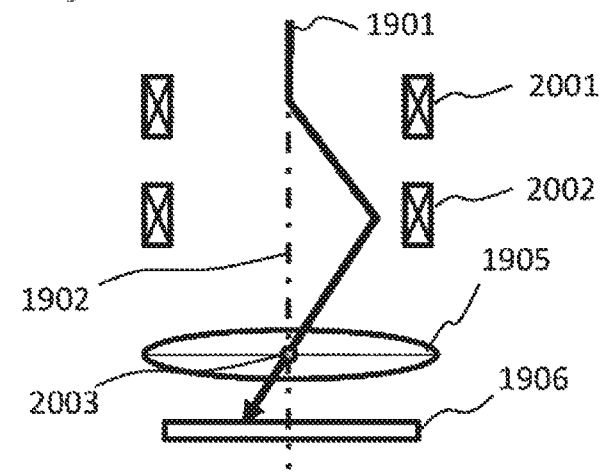

[Fig. 21]
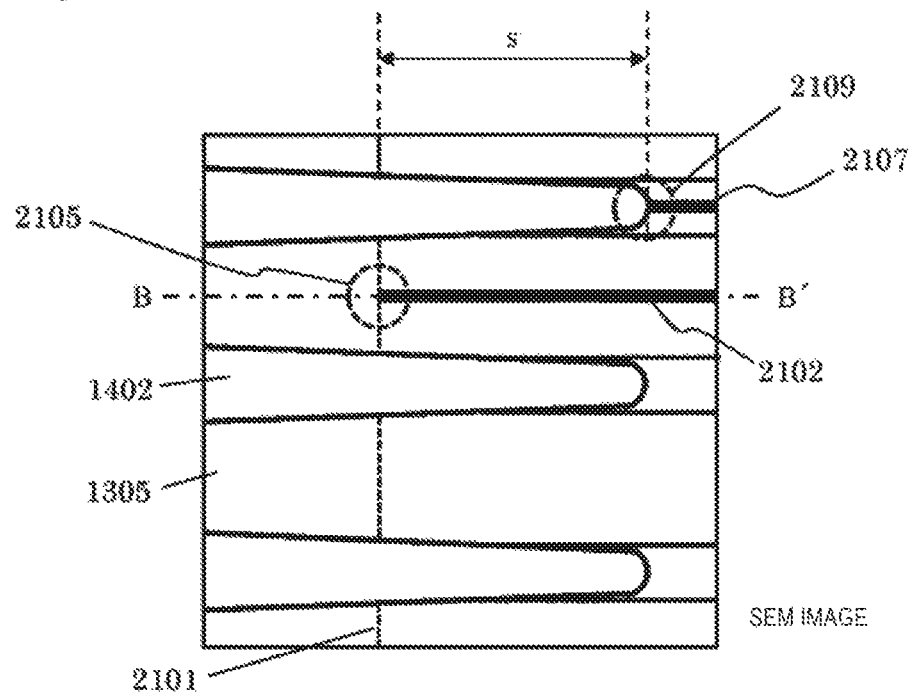
SEM IMAGE
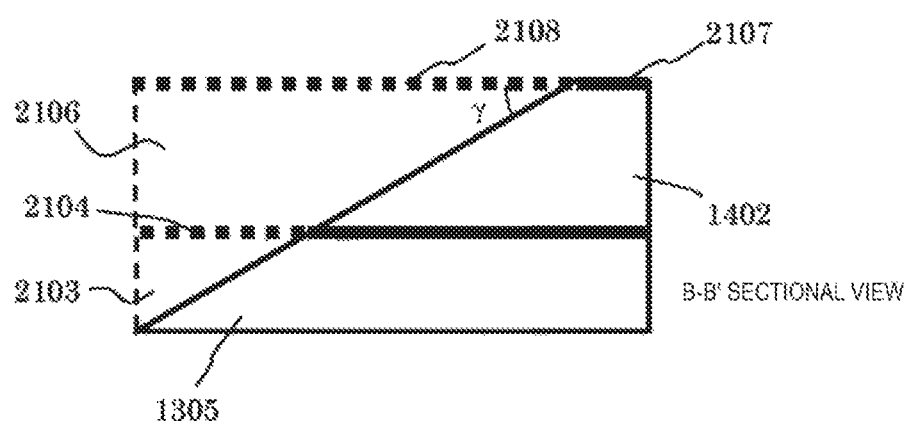
B-B' SECTIONAL VIEW

HEIGHT MEASUREMENT DEVICE AND CHARGED PARTICLE BEAM DEVICE

TECHNICAL FIELD

The present invention relates to a charged particle beam device and a height measurement device that measures a height of a sample or a pattern based on a signal acquired by the charged particle beam device, and particularly, to a charged particle beam device and a height measurement device that performs measurement with a beam irradiation mark formed by the charged particle beam device as a reference.

BACKGROUND ART

In a process of manufacturing a semiconductor device, the semiconductor devices are being recently further miniaturized, and the importance of pattern dimension management for process management has been increased. In recent years, the pattern is formed to have a three-dimensional structure, and thus, a manufacturing method of integrating the pattern has been applied. In order to manage the dimension of the pattern having the three-dimensional structure, it is necessary to evaluate performance of the pattern in a sectional direction. In order to evaluate the section of the pattern, it is considered that a sample is cut and the section of the pattern seen on a fracture surface is observed. A method in which a surface on which a section of the sample in a longitudinal direction is exposed is formed in the direction perpendicular to the sample surface by drilling the sample in a direction perpendicular to the sample surface without cutting the sample and the section thereof is evaluated is considered.

In PTL 1, a method in which a sample thickness t is calculated by forming a taper-shaped inclined surface by a focused ion beam (FIB), acquiring a surface observed image of the formed inclined surface by using an electron microscope, and calculating 2·X·tan α based on a scanning distance X of an electron line and an inclination angle α of the inclined surface has been described.

In PTL 2, an observation method of observing unevenness of the sample surface by drawing a straight line by using an ion beam is a portion in which the unevenness of the sample surface is desired to be observed and acquiring an image of the portion drawn from the straight line.

CITATION LIST

Patent Literature

PTL 1: JP-A-2005-235495
PTL 2: JP-A-2002-323311

SUMMARY OF INVENTION

Technical Problem

In recent years, the pattern needs to have the miniaturized three-dimensional structure, and there is an increasing need for high-accuracy measurement of a depth or a shape or a dimension of the pattern in a height direction in order to stabilize a machining process thereof. For example, a contact hole for causing hierarchies of a device having a plurality of hierarchical structures to be electrically continuous has only a diameter of dozens of nanometers in order to cope with the miniaturization. Meanwhile, the number of hierarchies is increased in order to cope with integration improvement, and thus, the depth is increased up to thousands of nanometers. A Fin line pattern of a FinFET device having a three-dimensional structure has a sectional shape having a width of dozens of nanometers and a height of about several times greater than the width. Since this line pattern is a passage through which a switching current passes, it is considered that it is necessary to manage a line width of the line with an accuracy of several nanometers in a height direction.

Meanwhile, in a mass-production process of the device, if the wafer is cut, since it is difficult to return the wafer to the subsequent process, the wafer is lost whenever the measurement is performed in the respective process management, and thus, a yield is deteriorated.

In a case where the wafer is cut and the section of the pattern is observed, since several hours are taken as a required time, even though an abnormality of the sectional shape is detected, it is difficult to enhance the process of the wafers manufactured in the mass-production line within several hours, and thus, the yield may be deteriorated.

Since a drilled volume is large in the method of drilling a hole in the direction perpendicular to the sample surface, a required time including a machining time is long, and thus, the yield may also be deteriorated.

As described in PTL 1, if there is an attempt to acquire information of the sample in the height direction based on a scanning distance X of an electron line and an inclination angle α of the machined inclined surface, it is difficult to perform high-accuracy measurement. In a case where the scanning distance is calculated, if a start point (or an end point) thereof is not accurately ascertained, it is not expected that the high-accuracy measurement is performed, and a method of accurately calculating a point as a measurement reference is not described in PTL 1. According to the method disclosed in PTL 2, it is possible to approximately ascertain the unevenness of the sample surface, but it is difficult to accurately calculate a dimension in a sample height direction.

Hereinafter, a charged particle beam device and a height measurement device capable of measuring a structure on a sample in a depth direction with high accuracy are suggested.

Solution to Problem

As an aspect for achieving the aforementioned object, there are provided a charged particle beam device and a height measurement device that include a calculation device which calculates a dimension of a structure on a sample based on a detection signal acquired by irradiating the sample with charged particle beams. The calculation device calculates a dimension between an irradiation mark of a first charged particle beam formed in a first height of the sample and an irradiation mark of a second charged particle beam formed in a second height of the sample, and calculates a dimension between the first height and the second height based on the dimension, irradiation angles using the charged particle beams when the irradiation marks of the first charged particle beam and the irradiation marks of the second charged particle beam are formed, or an angle of an inclined surface formed by cutting a part of the irradiation mark of the first charged particle beam and a part or the irradiation mark of the second charged particle beam.

As another aspect for achieving the aforementioned object, there is provided a height measurement method of measuring a dimension of a structure on a sample in a height direction. The method includes: forming an irradiation mark of a first charged particle beam and an irradiation mark of a second charged particle beam in a first height portion on the sample and a second height portion on the sample by irradiating the first height portion and the second height portion with the charged particle beams in a direction in which the charged particle beams are inclined at an angle of ☐ with respect to a vertical direction of the sample surface; and scanning the sample with the charged particle beams in the vertical direction after the irradiation mark of the first charged particle beam and the irradiation mark of the second charged particle beam are formed, measuring a dimensions between the irradiation mark of the first charged particle beam and the irradiation mark of the second charged particle beam based on a detection signal acquired through the scanning, and calculating a dimension between the first height portion and the second height portion based on the dimension s, the angle α, or an angle ☐γ of an inclined surface formed by cutting a part of the irradiation mark of the first charged particle beam and a part of the irradiation mark of the second charged particle beam.

Advantageous Effects of Invention

According to the aforementioned configuration, it is possible to measure a dimension of a pattern in a depth (height) direction with high accuracy.

BRIEF DESCRIPTION OF DRAWINGS

FIG. 1 is a diagram showing an outline of a scanning electron microscope.

FIG. 2 is a diagram showing an outline of a focused ion beam device.

FIG. 3 is a diagram showing an example of a measurement system including the scanning electron microscope and the focused ion beam device.

FIG. 4 is a diagram for describing a principle of measuring a dimension of a sample in a depth direction based on a scribe line formed using FIB.

FIG. 5 is a flowchart showing a process of calculating the dimension of the sample in the depth direction based on the formed scribe line.

FIG. 6 is a diagram showing a principle of a specification method of accurately specifying an inclination angle of an inclined beam.

FIG. 7 is a flowchart showing a process of scribe line machining using the FIB.

FIG. 8 is a flowchart showing a process of measuring a dimension of the sample in which the scribe line is formed in a height direction by using a scanning electron microscope (SEM).

FIG. 9 is a diagram showing an example of a SEM image to which a measurement cursor for measuring a dimension between the scribe lines is set.

FIG. 10 is a diagram showing an example in which machining marks using the FIB are formed in different height positions of the sample.

FIG. 11 shows an example of a combined device including the SEM and the FIB.

FIG. 12 is a flowchart showing a height measurement process using the combined device using the SEM and the FIB.

FIG. 13 is a diagram showing an example in which the machining marks using the FIB are formed in an oxide film and a Fin top of a Fin of a Fin-FET.

FIG. 14 is a diagram showing a state of the sample after oblique machining is performed on the sample and the scribe lines are formed.

FIG. 15 is a diagram showing a SEM image of an area including the scribe lines formed in the oblique-machined surface and a section of the sample displayed on the SEM image.

FIG. 16 is a diagram showing an example of the sample in which beam irradiation marks are formed in a first height and a second height by irradiating a stepped portion with an inclined beam.

FIG. 17 is a flowchart showing a process of measuring a height after the beam irradiation marks are formed in different sample heights.

FIG. 18 is a flowchart showing a process of generating a template for specifying an irradiation mark of a FIB device by using the SEM based on an image acquired by the FIB device.

FIG. 19 is a diagram showing a beam orbit when the irradiation using the inclined beam is performed.

FIG. 20 is a diagram showing the beam orbit when a field of view is moved from an ideal optical axis.

FIG. 21 is a diagram showing an example of the SEM image when the oblique machining is performed after the beam irradiation marks are formed.

DESCRIPTION OF EMBODIMENTS

Hereinafter, a charged particle beam device and a height measurement device that measures a dimension of a structure on the sample in a height direction by forming irradiation marks of beams in different heights on a sample through the irradiation using the charged particle beam and measuring dimensions between the irradiation marks be described.

FIG. 4 is a diagram for describing a principle of height measurement based on measurement between beam irradiation marks. Ion beams are obliquely incident on a sample surface toward the left from the right of this diagram, and thus, the sample surface is obliquely drilled. As a result, an inclined surface is formed so as to descend toward the left from the right of this diagram. Scribe lines arranged in parallel at equal intervals are drawn in a wafer surface including the inclined surface by using an inclined. FIB that is inclined at a from a line which is perpendicular to the wafer surface. For example, it is assumed that the interval is 20 nm. Thereafter, a wafer is measured in a top-down direction, that is, in a direction perpendicular to the wafer surface by the charged particle beam device having a dimension measurement function such as a critical dimension-SEM (CD-SEM). In this case, a misalignment (s) caused between the scribe line on the wafer surface and the scribe line on the inclined surface is measured by the CD-SEM.

Since an irradiation direction of the FIB that draws the scribe lines is inclined with respect to the wafer surface, as the inclined surface becomes deeper from the wafer surface, s becomes larger. Thus, whether or not how deep a drawing line on the inclined surface is positioned from the wafer surface can be measured by measuring s.

A depth (d) of a portion in the inclined surface on which one scribe line is drawn is calculated by the following expression by geometrical consideration.

$$d = s/\tan(\alpha) \qquad \text{Expression 1}$$

Since the scribe lines are drawn at intervals of 20 nm, even though the inclined surface is locally uneven or is not flat, the depth of the inclined surface may be measured at every depth of about 20 nm. Since a line width of the FIB drawing line is very thin as a nanometer unit and drawing accuracy using the FIB is sufficiently high, it is possible to specify the depth with accuracy of sub-nanometers.

FIG. 5 is a flowchart, showing a process of calculating the depth of the drawing line after the scribe line is formed. In actual pattern measurement, the scribe lines are drawn so as not to overlap patterns to be measured. For example, the scribe lines are drawn between the patterns to be measured by using the FIB even though the scribe lines are not formed at equal intervals. The depths of the scribe lines present on both sides of a certain pattern to be measured are measured by the above-described method, and an average value thereof may be regarded as the depth of the pattern to be measured.

However, since it is important to accurately as certain an inclination angle of the inclined FIB in terms of measurement accuracy of final measurement, high-accuracy measurement method of the inclination angle is required. FIG. 6 is a diagram showing an example in which the inclination angle of the ion beam is measured. A virtual plane perpendicular to an incident direction is scanned with the FIB such that a true circle having a diameter (D) is drawn on the virtual plane by using the FIB. Since the FIB is inclined, an ellipse is drawn on an actual wafer surface due to such inclination. A short diameter (A) and a long diameter (B) in a direction perpendicular to the incident direction are measured by the CD-SEM, and thus, it is possible to calculate an actual inclination angle with accuracy. An inclination angle ($\theta$) of the FIB with respect to the inclined surface of the wafer is calculated by the following expression by geometrical consideration.

$$\theta = \arcsin(D/B) \quad \text{Expression 2}$$

Since the inclination angle ($\theta$) is a relative angle between the ion beam and the sample surface, the calculation of Expression 3 is performed such that the inclination angle can be substituted in Expression 1.

$$\alpha = 90° - \theta \quad \text{Expression 3}$$

It is possible to accurately measure a dimension of the sample in the height direction by previously storing the above-described calculation expression in a predetermined storage medium and performing the above-described calculation based on a detection signal acquired by the charged particle beam device. As shown in FIG. 6, it is possible to calculate an accurate irradiation angle of the beam while referring to a size of a drawing pattern formed on the sample and a size of an irradiation range of the charged particle beam. The virtual plane is scanned with the beam along the true circle, and thus, it is possible to easily specify edge portions having the largest diameter (edge portions having a long diameter B) in a drawn geometric pattern from a two-dimensional image.

Hereinafter, the details of the height measurement device capable of measuring the above-described measurement or the charged particle beam device that supplies information required in the height measurement device will be described. FIG. 1 is a diagram showing an outline of a SEM 100. An electron beam 103 which is extracted from an electron source 101 by an extracting electrode 102 and is accelerated by an acceleration electrode (not shown) is narrowed by a condenser lens 104 which is one type of a focusing lens, and is one-dimensionally or two-dimensionally scanned on a sample 109 by a scanning deflector 105. The electron beam 103 is decelerated by a negative voltage applied to the electrode built in a sample stage 108, and is focused by a lens action of an objective lens 106. Thus, the sample 109 is irradiated with the electron beam. An internal space of a sample chamber 107 is maintained in a predetermined vacuum level by a vacuum pump (not shown).

If the sample 109 is irradiated with the electron beam 103, electrons 110 such as secondary electrons and backscattered electrons are emitted from the irradiation portion. The emitted electrons 110 are accelerated in an electron source direction by an acceleration action based on the negative voltage applied to the sample, and collide with a conversion electrode 112. Thus, secondary electrons 111 are generated. The secondary electrons 111 emitted from the conversion electrode 112 are trapped by a detector 113, and an output of the detector 113 is changed depending on the amount of captured secondary electrons e Luminance of a display device (not shown) is changed depending on this output. For example, in a case where a two-dimensional image is formed, an image of a scanning area is formed by synchronizing a deflection signal to the scanning deflector 105 and the output of the detector 113. The scanning electron microscope illustrated in FIG. 1 includes a deflector (not shown) that moves on a scanning area of the electron beam. This deflector is used for forming an image of patterns which are present in different positions and have the same shape. This deflector is called an image shift deflector, and allows the position of the field of view of the electron microscope to be moved without the movement of the sample using the sample stage. The image shift deflector and the scanning deflector may be used as a common deflector, an image shift signal may be superimposed on a scanning signal, and the superimposed signals may be supplied to the deflector.

Although it has been described in the example of FIG. 1 that the electrons emitted from the sample are converted using the conversion electrode and are detected, the present invention is not limited to such a configuration, and a detection surface of the detector or an electron multiplier may be formed in, for example, an orbit of the accelerated electrons.

A control device 120 controls the respective components of the scanning electron microscope, and has a function of forming an image based on the detected electrons or a function of measuring a pattern width of the pattern formed on the sample based on an intensity distribution of the detected electrons, which is called a line profile. A calculation device ((not shown) may be built in the control device 120, and the dimension of the pattern in the height direction may be measured based on calculation expressions such as Expression 1 and Expression 2.

FIG. 2 is a diagram showing an outline of an FIB device 200. This device includes a liquid metal ion source 201 that emits desired ions, an extracting electrode 202 that extracts the ions from the liquid metal ion source 201, an aperture 204 that causes only the central portion of emission ions 203 to pass toward a downstream, a focusing lens 205 that controls the spreading of the emitted ions, a blanker 207 that shifts the orbit of the ion beam such that the ion beam does not temporarily reach a front surface of a sample 206, a diaphragm 208 that adjusts a beam current and a beam diameter, an aligner 209 that corrects the orbit of the ion beam on an optical axis, a deflector 210 that scans and sweeps the sample surface with the ion beam, an objective lens 211 that focuses the ion beam on the sample surface, a sample stage 212, and a secondary electron detector 214 that traps the secondary electrons emitted when a focused ion beam 213 is incident on the front surface of the sample 206.

A control device 215 that controls the respective components is further provided. The control device 215 performs machining for forming a hole in a desired area by irradiating a predetermined machining position with the ion beam 213 of which the current is adjusted by the diaphragm 208 and scanning the machining position with the ion beam 213 by the deflector 210. The sample stage 212 includes a movement mechanism (not shown), and allows the sample 206 to move in the X-Y direction (when the irradiation direction of the ion beam is a Z direction) and the Z direction and to perform an operation such as tilting or rotation.

The control device 215 performs inclination irradiation shown in FIGS. 4 and 6 on the sample by using the sample stage 212 or a deflector (not shown) for tilting the beam.

FIG. 3 is a diagram, showing an example of a measurement system including the SEM 100 and the FIB device 200. The system illustrated in FIG. 3 includes the SEM 100, the FIB device 200, a calculation processing device 301, and a design data storage medium 302. The calculation processing device 301 includes a calculation processing unit 304 that supplies a control signal including a measurement condition or a machining condition to the SEM 100 or the FIB device 200 and performs a process related to the measurement of the pattern based on the detection signal or the measurement result acquired by the SEM 100, and a memory 305 that stores a recipe which is an operation program for determining the measurement condition or the machining condition or the measurement result. The detection signal acquired by the SEM 100 is supplied to image processing hardware such as CPU, ASIC, or FPGA built in the calculation processing device 301, and image processing is performed on the detection signal according to the purpose.

The calculation processing unit 304 includes a machining condition setting unit 306 that sets the machining condition of the FIB 200, a measurement condition setting unit 307 that sets the measurement condition using the SEM 100, an area setting unit 308 that sets an image acquisition area or a measurement box, a measurement execution unit 309 that performs the measurement based on the detection signal acquired by the SEM 100, and a height calculation unit 310 that calculates a height of the pattern based on the previously stored calculation expressions such as Expression 1 and Expression 2 in the memory 305. The machining condition or the measurement condition may be set by an input device 303, and a recipe for machining or measurement is generated based on the setting.

In the memory 305, coordinate information of the set machining position is stored as the measurement condition of the SEM 100 and information of an incident angle of the ion beam is stored as information used by the height calculation unit 310 for calculating a height (depth).

Hereinafter, a scribe line machining process using the FIB will be described with reference to a flowchart shown in FIG. 7. Initially, the sample which is a machining target is introduced into the sample chamber of the FIB device 200 (step 701), and the sample stage 212 (stage) is driven such that an irradiation position of the FIB is positioned in a processing area set by a processing area setting unit 306 (step 702). The sample stage 212 is inclined according to the irradiation angle of the beam set by the machining condition setting unit 306 (step 703), and oblique drilling for forming a machined inclined surface shown in FIG. 4 is performed by irradiating the sample with the ion beam in a state in which the sample is inclined (step 704).

After the oblique drilling is performed, the sample stage 212 is inclined again such that the beam irradiation angle is used for machining the scribe lines while referring to the beam irradiation angle set by the machining condition setting unit 306 again (step 705) After the sample is inclined, marks that enable angle evaluation shown in FIG. 6 are formed (step 706). In this case, the marks are formed by irradiating areas which are except for oblique drilling areas and scribe areas on a semiconductor wafer in which the patterns are not present with the beam while maintaining the sample inclination angle set in step 705.

After the marks are formed, the beam irradiation for forming the scribe lines is performed (step 707). The marks may be formed after the scribe lines are formed. In this case, one scribe line is formed without changing an irradiation angle between a machined surface and a unmachined surface and an irradiation position in an K direction (a sample surface direction perpendicular to the scribe line of FIG. 4), and thus, a gap (s) between the scribe lines formed in the machined inclined surface and the unmachined surface in the direction is a value that reflects the irradiation angle α and the depth d of the beam. Thus, it is possible to measure the depth by performing the calculation using Expression 1. Although it has been described in the present embodiment that the plurality of scribe lines is formed at equal intervals, as long as a portion on which the depth is evaluated is previously determined, only one scribe line may be formed. If the plurality of scribe lines is formed at equal intervals w with the scribe line formed in an inclination start point of the machined inclined surface of FIG. 4 as its reference, a depth of an n-th scribe line (a case where the scribe line formed in the inclination start point is set to be a 0-th scribe line) formed in the machined inclined surface of which the relative angle with respect to the sample surface is θ may be calculated by Expression 3.

$$d_n(n \cdot w + s) \cdot \tan \theta \qquad \text{Expression 3}$$

The sample depth $d_n$ calculated by Expression 3 is an ideal value in a case where the machined inclined surface is formed as a flat surface, but there are some cases where the inclined surface machined using the FIB is not actually a completely flat surface, and there are some cases where the machined inclined surface exposed to the non-flat inclined surface is uneven.

Here, the plurality of scribe lines is formed, and thus, a depth in an arbitrary position on the machined inclined surface is accurately calculated. A depth of a desired position on the machined inclined surface is calculated by generating an approximation function indicating a shape of the machined inclined surface based on depth information of the position of each scribe line such that such measurement is able to be performed and substituting positional information in the sample surface direction in the approximation function. According to such a method, it is possible to accurately calculate a depth even in a portion in which the scribe line is not formed.

Although it has been described in the above-described embodiment that the irradiation mark of the beam is formed through sputtering using the ion beam and the depth is measured with the irradiation mark as the measurement reference, the irradiation mark may be formed through deposition for forming a film on a desired portion without performing the sputtering. In this case, an introduction hole of a compound gas is provided within a focused ion beam device, and thus, a film is selectively formed due to reaction with the ion beam.

The irradiation mark formed as described above is used in the measurement, and thus, it is possible to measure the depth with high accuracy. Although it has been described above that the scribe line or the machined inclined surface is formed by inclining the stage, the scribe line or the machined inclined surface may be formed by using a FIB device provided in the sample chamber in a state in which a beam column that performs the irradiation using the ion beam is inclined or a FIB device having an inclination irradiation function of the beam. For example, in order to incline the ion beam, the inclination irradiation performed on a beam irradiation point is realized by providing a deflector for deflecting the ion beam outside an ideal optical axis of the ion beam, deflecting the ion beam outside an axis of the objective lens by the deflector, and using a swing-back effect of the objective lens.

Hereinafter, a process of measuring the dimension of the sample in which the scribe lines are formed in the height direction by using the SEM will be described with reference FIG. 8. Initially, the sample 109 such as a semiconductor wafer as a measurement target is introduced into the sample chamber 107 of the SEM illustrated in FIG. 1 (step 801). The machined inclined surface and the scribe lines are formed in the sample 109, and the measurement condition setting unit 307 drives the sample stage 108 such that the portion on which such forming is performed is irradiated with the electron beam (step 802).

Subsequently, an SEM image of an area in which the scribe line is formed is acquired by scanning the sample 109 positioned in the scanning area of the electron beam with the electron beam (step 803). As shown in FIG. 9, a scribe line 903 on the sample surface and a scribe line 904 on the machined inclined surface which are formed with a boundary line 902 between the machined surface and the unmachined surface therebetween are included in an acquired SEM image 901, and a dimension s between both scribe lines in the X direction (the inclination direction of the ion beam when the scribe lines are formed) is measured (step 804). In this case, the irradiation angle when the irradiation using the ion beam is performed is calculated using the marks formed in step 706 of FIG. 7.

The measurement execution unit 309 sets measurement cursors 904 and 905 to two scribe lines on the SEM image, and measures a dimension between two scribe lines based on the positions of the scribe lines within the measurement cursors. In this case, although a peak position of a luminance profile within the measurement cursor may be used as the measurement reference, there are some cases where it is difficult to specify an accurate position of the scribe line in a case where a width of the scribe line (a machining mark due to the ion beam irradiation) is wide. In this case, the measurement may be performed by performing a binarization process of the image based on a luminance difference between the portion of the scribe line and the portion exception for the scribe line and using a center of an area extracted as a scribe line area in the X direction as a scribe line position.

In order to specify the scribe line position as the measurement reference, a template in which the scribe line position is represented may be previously prepared, and measurement target position may be specified through template matching using the template. Since a state of the machining mark is changed depending on an irradiation condition using the ion beam, an image processing algorithm in which the machining mark is changed depending on the machining condition may be stored, and the template may be generated through machining condition setting using the machining condition setting unit 306. The machining mark may not be a straight line illustrated in FIG. 9, and may be at least two discontinuous patterns 1001 and 1002 illustrated in FIG. 10. As long as the measurement reference has a unique shape as stated above, it is possible to easily specify the positions of the patterns through the template matching. It is possible to use even the separated patterns described above as reference patterns for measuring the height by performing beam irradiation for forming two patterns without changing the beam irradiation position in the X direction.

Subsequently, the height calculation unit 310 calculates a depth d of the portion in which the scribe line is formed by using Expression 1 which is the calculation expression previously stored in the memory 305, and outputs the result thereof to the display device provided in the input device 303 (steps 805 and 806).

It is possible to acquire information in the depth direction with a resolution level of the electron microscope according to the SEM that performs the measurement process based on an operation program as described above.

Hereinafter, an example in which the height is measured using the irradiation marks of the beam will be described using a combined device including both the SEM and the FIB. FIG. 11 shows an outline of the combined device including the SEM and the FIB. Two FIB columns 1104 and 1105 are provided in the sample chamber 107 of the SEM 100. An air purification space forming device 1101 and a preliminary exhaust chamber (load-lock chamber) 1103 are provided in the combined device illustrated in FIG. 11. The air purification space forming device 1101 is provided with a mechanism for increasing an internal pressure, and is configured to prevent dust from the outs de from entering the combined device. A robot 1102 for introducing the sample 109 into the preliminary exhaust chamber 1103 is provided within the air purification space forming device 1101, and the sample 109 is introduced into the preliminary exhaust chamber 1103 through the air purification space forming device 1101. The sample 109 after ambient atmosphere is preliminarily exhausted by the preliminary exhaust chamber 1103 is introduced into the sample chamber 109 (step 1201 of FIG. 12)

Subsequently, the sample stage 108 is driven such that the measurement target position on the sample 109 is positioned in the beam irradiation position using the FIB columns 1104 and 1105, and the oblique drilling through the ion beam irradiation is performed (step 1201). The FIB column 1104 is provided such that a relative angle with respect to a vertical line of the sample surface s relatively larger than that of the FIB column 1105 and the irradiation using the beam is performed in a direction suitable for forming the machined inclined surface illustrated in FIG. 4. The oblique drilling is performed using the FIB column 1104. Subsequently, the scribe line s machined using the FIB column 1105 (step 1203).

As mentioned above, it is possible to measure the height of the sample without unloading the sample to the outside of a vacuum sample chamber by performing the drilling by using the FIB columns 1104 and 1105 that share the sample chamber 107 with the SEM 100. The dimension between the scribe lines formed as described above is measured, and the height is calculated based on the calculation expression represented by Expression 1 (steps 1205 and 1206. In FIG. 11, the SEM 100 and the FIB columns 1104 and 1105 have different beam irradiation positions such that a distance (working distance) between the objective lens 106 and the sample 109 is as short as possible. The beam irradiation positions of the SEM 100 and the FIB columns 1104 and 1105 match each other, and thus, the machining and observation may be performed without moving the sample. Since it is necessary to secure a space in which the FIB columns are provided, it is difficult to shorten the working distance of the SEM, and thus, the SEM and the FIB are provided so as to be separated from each other in the configuration illustrated in FIG. 11 in terms of the resolution of the electron microscope. Although it is necessary to secure a rectangular area in which one side is greater than twice the diameter of the sample 109 within the sample chamber 107 with the irradiation position of the ion beam as its center in order to machine an arbitrary position of the sample 109 using the FIB, as long as a test pattern for evaluating the depth is formed in a certain specific scribe line area, only the specific scribe line area may be irradiated with the ion beam, and thus, it is possible to provide the sample chamber 107 with a small size. The FIB column may be provided in the preliminary exhaust chamber 1103. The preliminary exhaust chamber 1103 may have a small size in order to increase an exhaust speed, but if the irradiation portion using the ion beam is previously determined, since the FIB column for irradiating this portion with the ion beam may be provided, it is possible to provide the FIB column without using the preliminary exhaust chamber with a large size.

Although it has been described above that the CD-SEM is primarily used as the measurement device of the pattern, a high-resolution ion microscope that uses a helium ion or a hydrogen ion as a beam source may be used instead of the CD-SEM.

Although it has been described that parallel lines are drawn on the wafer surface and the inclined surface by using the inclined FIB inclined by a from the vertical line of the wafer after the inclined surface is machined, the measurement is performed in the top-down direction by using the device capable of performing the high-accuracy measurement such as the CD-SEM, and the dimension of the sample in the height direction is measured based on the measurement result and α. It is possible to extremely narrow the line width of the FIB drawing line such that the line width is about 5 nm, and since the drawing accuracy using the FIB is sufficiently high, it is possible to specify the depth with an accuracy of sub-nanometers.

Meanwhile, an example in which the height of the pattern formed on the sample is measured without forming the machined inclined surface will be described. In FIG. 13, an upper diagram shows a top-down image of a Fin-FET, and a lower diagram shows a section of the Fin-FET. In the example of FIG. 13, the scribe lines are formed in some of Fins 1302 by using the ion beam. FIG. 13 shows a Fin-FBI structure in which a plurality of Fins 1302 is formed in an oxide film 1305 and gate patterns 1301 are formed on the Fins 1302 and the oxide film 1305. Since an ion beam 1306 is incident so as to be inclined by an angle of α in a vertical direction of the sample surface, scribe lines 1303 are formed in sidewalls of the Fins 1302.

Since the height of the Fin 1302 on the oxide film 1305 is an important index to evaluate capabilities of a transistor, the index value is calculated by measuring dimensions between the scribe lines 1303 formed on the Fin 1302 and scribe lines 1304 formed on the oxide film 1305 in the present example. When the dimensions are measured, a distance between peaks of a waveform signal acquired by selectively averaging signals acquired when the Fins 1302 are scanned and a waveform signal acquired by selectively averaging signals acquired when the oxide film 1305 is selectively scanned may be calculated. Since it is possible to control the irradiation marks of the ion beam by adjusting a device condition of the FIB device, the position may be identified based on a waveform processing method depending on a beam condition of the ion beam. For example, in a case where the scribe line is thick, since a width of a low-luminance area becomes wider as the scribe line becomes thicker, a center of an area of which a luminance value is equal to or less than a predetermined value may be used as a position of the scribe line. In a case where the scribe line is thin, the peak position (portion of which the luminance is lower than the predetermined value) may be used as the position of the scribe line.

As stated above, in a case where the height of the Fin is calculated, since a Fin pattern vertex and the oxide film are seen on the SEM image even though oblique machining is not performed, if the scribe lines are formed as illustrated in FIG. 13, the height of the Fin can be measured. However, it is possible to ascertain the section of the sample as two-dimensional information by forming the inclined surface, and thus, it is possible to easily specify the machining position or the measurement position. For example, since a pattern shape appearing on the inclined surface is able to be previously predicted, a pattern image appearing on the inclined surface may be previously stored as the template, and the machining position or the measurement cursor may be aligned through a matching process.

As stated above, if the inclined surface is formed, since it is possible to ascertain the information of the height direction (Z direction) as information of two-dimensional direction (X-Y reaction), it is possible to acquire many information items for automatically and smoothly measuring the pattern. As stated above, both the scribe line and the inclined surface are formed, and thus, it is possible to automatically perform high-accuracy measurement.

FIG. 14 is a diagram showing an example in which both the scribe lines 1303 and 1304 and the machined inclined surface are formed on the Fin-PET structure by using the ion beam. A range 1401 is an area in which the machined inclined surface is formed. A Fin section 1402 and a dummy pattern 1403 acquired by cutting a part thereof through the oblique drilling are exposed to the machined inclined surface. An upper diagram of FIG. 15 shows an SEM image of an area 1404 of FIG. 14, and a lower diagram of FIG. 15 shows the section of the area 1404. As illustrated in FIG. 15, since it is possible to acquire information of a section direction, which is not normally seen in the top-down image, from the top-down image by performing the oblique drilling, it is possible to perform the arrangement of the cursors for performing the measurement or machining a desired position by using the top-down image. In the example of FIG. 15, since it is possible to measure a distance $f_s$ from the top-down image, it is possible to calculate a height $f_h$ of the Fin based on the $f_s$ and a forming angle (irradiation angle of the ion beam) α of the scribe line.

Since there are some cases where the scribe line formed using the FIB is thick and it is difficult to calculate an accurate machining position, the binarization process may be performed between the scribe line portion and the portion other than the scribe line through the image processing, the center of the area determined as the scribe line in the K direction (in the case of FIG. 15) may be calculated, and a central position in the X direction may be specified as the position of the scribe line. Since the scribe line becomes darker than that of other portion in the SEM image as the scribe line portion becomes more deeply drilled, an accurate position of the scribe line may be specified by performing the binarization process using the luminance difference.

Although it has been described above that the dimension of the sample in the height direction is measured using the irradiation marks of the ion beam, it is possible to form the irradiation marks by using, for example, the electron beam. For example, it is considered that the sample is partially charged by irradiating the sample with the electron beam under a condition in which the sample is charged. Since a detection efficiency of the secondary electrons is changed between a charged portion and a portion other than the charged portion by partially charging the sample, a contrast is formed between both the portions, and it is possible to specify the charged portion. For example, if the sample is positively charged, since some of the secondary electrons emitted from the portion is drawn toward the sample, the charged portion becomes relatively darker than that of the other portion. It is possible to form the irradiation marks of the electron beam by generating the contrast by using such a phenomenon.

For example, in order to charge the sample, it is considered that the beam irradiation is performed by selecting a reaching energy of a beam of which a secondary electron emission efficiency δ of the sample as a irradiation target of the beam is greater than 1 (positive charging) or is less than 1 (negative charging). It is considered that the irradiation marks are left by attaching contamination through the irradiation using the electron beam by using hydrocarbon slightly remaining within the sample chamber. If the sample is irradiated with a beam with high energy and high dose, the coupling of H—C is disconnected and C is attached to the surface, it is possible to form the irradiation marks of the electron beam.

FIG. 16 is a diagram showing an example of a sample having a stepped portion in order to show an example in which a sample upper portion 1601 and a sample lower portion 1602 are formed so as to be separated by a height h. A process of calculating the height h by irradiating such a sample with an electron beam 1603 passing through a virtual straight line inclined by an angle of α will be described with reference to FIG. 17. Initially, the sample 109 is introduced into the sample chamber 107 (step 1701), and a first irradiation mark 1604 is formed by irradiating a first height with an inclined beam under a first beam condition (step 1702). The first beam condition is a beam condition in which the sample is charged in a case where the sample is charged and the irradiation mark is left, and a beam condition depending on a material of the sample upper portion 1601 is selected. Subsequently, a second height is irradiated with the inclined beam under a second beam condition without changing the irradiation angle of the inclined beam and the irradiation position in the Y direction (step 1703). Here, the second beam condition is the same as the first beam condition in a case where the material of the sample lower portion 1602 is the same as that of the sample upper portion 1601, and is a beam condition in which the material of the sample lower portion 1602 is charged in a case where the materials of the sample lower portion and the sample upper portion are different from each other. Thus, a second irradiation mark 1605 is formed.

As described above, a scanning area of the electron beam is set so as to include the formed irradiation marks 1604 and 1605 within a field of view, and a dimension g between the first irradiation mark 1609 and the second irradiation mark 1605 in the Y direction is measured based on a detection signal acquired through the beam scanning (steps 1704 and 1705). The height h is calculated by calculating g/tan α based on the beam inclination angle α and the dimension g acquired as stated above (step 1706).

According to the above-described method, it is possible to measure the dimension of the sample in the height direction based on the irradiation marks formed based on the irradiation using the electron beam.

For example, in order to incline the electron beam, it is considered that a beam-inclining deflector 1904 for irradiating an ideal optical axis 1902 (the beam orbit when the beam is not deflected) of the electron beam with the inclined beam is provided, as shown in FIG. 19. The beam inclining deflector 1904 changes an angle at which an electron beam 1901 reaches the sample 1906 by deflecting the electron beam 1901 in an object point 1903 of the objective lens 1905. The electron beam 1901 deflected toward the right side on the paper by the beam-inclining deflector 1904 is deflected toward the ideal optical axis 1902 again by a swing-back effect of an objective lens 1905. The object point 1903 is used as a deflection fulcrum, and thus, it is possible to irradiate an intersection of a surface of the sample 1906 and the ideal optical axis 1902 with the electron beam 1901 irrespective of the magnitude of a deflection angle θ.

In a case where an irradiation target portion on the sample is not present under the ideal optical axis 1902 of the beam, a viewing position may be moved with an intersection 2003 of the objective lens 1905 and the ideal optical axis 1902 as the deflection fulcrum by using deflectors 2001 and 2002 for moving a scanning position (field of view) of the beam, and the inclining irradiation of the beam may be performed using the irradiating state using the beam, as shown in FIG. 20.

In the case of the combined system illustrated in FIG. 3, since the field of view of the SEM 100 is positioned in a machining position of the FIB device 200, it is considered that the calculation processing device 301 acquires coordinate information of a machining target position and a scanning ion microscope (SIM) image of the machining target position from the FIB device 200 and the measurement condition of the SEM 100 is set. The measurement condition setting unit 307 sets a movement condition of the sample stage 108 based on the acquired coordinate information, and generates a template for accurately setting a beam scanning position in the measurement target position based on the acquired SIM image. FIG. 18 is a diagram showing the process thereof. The SIM image is acquired (step 1801), and the SIM is registered as a template for the SEM: by performing the image processing (step 1802) for correcting a difference between the SEM image and the SIM image according to a predetermined condition (step 1803).

According to such a configuration, it is possible to simplify setting of an installation condition of the SEM. Since the irradiation marks of the ion beam or the electron beam have features different from those of the edges of the pattern, it is possible to easily set the condition for automatic measurement by previously setting the position specification method or the templates depending on the features, as an algorithm.

FIG. 21 is a diagram showing another example of the height measurement method based on the inclined surface machining and the scribe line machining using the FIB. In the present example, after the scribe line machining is performed, the inclined surface machining is performed. For example, a scribe line 2102 is formed using the FIB before the inclined surface machining is performed. For example, a scribe line 2106 is formed in the oxide film 1305 by performing the FIB machining: at a depth of about 1 nm or less. After the scribe line 2102 is formed, the inclined surface machining is performed such that a part 2103 of the oxide film and a part 2106 of the Fin are cut. Since an end 2105 of the scribe line 2102 appears by performing such machining, it is easy to specify the tilting start point.

In the present example, a tilting start point 2101 is a portion as the measurement reference. Since both the flat surface and the inclined surface are the oxide films and the contrast is difficult to be generated, there are some cases where it is possible to accurately specify the boundary. Meanwhile, in the present example, it is possible to clarify the tilting start point as the measurement reference irrespective of contrast insufficiency of the oxide film since the end 2105 is used as tilting start point by performing cutting machining on a scribe line 2104 formed in the part 2103 of the oxide film.

An end 2109 which is the other measurement reference may be clarified by performing the inclined surface machining such that a scribe line 2107 is formed in a Fin top in addition to forming the oxide film and a scribe line 2108 is cot. It is possible to clarify a measurement reference point through the inclined surface machining by forming the scribe lines so as to cross the virtual straight line formed along the oblique-machined surface. Although it has been described in the present example that the scribe lines are formed as the straight line, the present invention is not limited thereto. As long as machining is performed such that the scribe lines are left over the tilting start line, the irradiation mark may have an arbitrary shape. Since the edges may be formed in a direction perpendicular to a dimension measurement direction, the measurement reference may be clarified by forming not the line-shaped irradiation marks but two-dimensional marks.

The calculation processing unit 304 calculates Expression 4 from the angle β of the inclined surface and the dimension s between the end 2105 and the end 2109, and thus, it is possible to accurately calculate a Fin height d with the oxide film surface as a reference.

$$d = s \times \tan \gamma \qquad \text{Expression 4}$$

REFERENCE SIGNS LIST

100 SEM
101 Electron source
102 Extracting electrode
103 Electron beam
104 Condenser lens
105 Scanning deflector
106 Objective lens
107 Vacuum sample chamber
108 Sample stage
109 Sample
110 Electron
111 Secondary electron
112 Conversion electrode
113 Detector
120 Control device
200 FIB device
201 Liquid metal ion source
202 Extracting electrode
203 Emission ion
204 Aperture
205 Focusing lens
206 Sample
207 Blanker
208 Diaphragm
209 Aligner
210 Deflector
211 Objective lens
212 Sample stage
214 Secondary electron detector
215 Control device
301 Calculation processing device
302 Design data storage medium

The invention claimed is:

1. A height measurement device comprising:
   a controller programmed to calculate a dimension of a structure on a sample based on a detection signal acquired by irradiating the sample with a charged particle beam,
   wherein the controller
   calculates a first dimension between a first irradiation mark of the charged particle beam formed in a first height of the sample and a second irradiation mark of the charged particle beam formed in a second height of the sample, and a second dimension between a third irradiation mark of the charged particle beam formed in the first height of the sample and a fourth irradiation mark of the charged particle beam formed in a third height of the sample,
   calculates a dimension between the first height and the second height in a direction of the first height based on the first dimension and irradiation angles using the charged particle beam when the first irradiation mark and the second irradiation mark are formed,
   calculates a dimension between the first height and the third height in a direction of the second height based on the second dimension and irradiation angles using the charged particle beam when the third irradiation mark and the fourth irradiation mark are formed, and
   calculates an average value of the dimension in the direction of the first height and the dimension in the direction of the second height.

2. The height measurement device according to claim 1, wherein the irradiation mark of the first charged particle beam and the irradiation mark of the second charged particle beam are formed by irradiating the sample with charged particle beams inclined at an angle of a with respect to a vertical direction of the sample surface.

3. The height measurement device according to claim 2, wherein the controller calculates dimensions d of the first height and the second height based on a dimension s between the irradiation mark of the first charged particle beam and the irradiation mark of the second charged particle beam and $d = s/\tan(\alpha)$.

4. The height measurement device according to claim 1, wherein the controller calculates dimensions between first heights and second heights of a plurality of portions in the sample based on calculation of a plurality of dimensions between irradiation marks of a plurality of first charged particle beams and irradiation marks of a plurality of second charged particle beams which are formed in the sample.

5. The height measurement device according to claim 1, wherein the controller calculates the irradiation angles of the charged particle beams when the irradiation mark of the first charged particle beam and the irradiation mark of the second charged particle beam are formed based on the detection signal.

6. The height measurement device according to claim 5, wherein the controller performs calculation using the following calculation expression based on the detection signal:
   $\theta = \arcsin(D/B)$, where
   $\theta$ = incident angle of the charged particle beam,
   D = size of drawing pattern formed in the sample, and
   B = size of irradiation range using the charged particle beam.

7. The height measurement device according to claim 1, wherein the controller calculates dimensions d of the first height and the second height based on a dimension s between the irradiation mark of the first charged particle beam and the irradiation mark of the second charged particle beam, an angle γ of the inclined surface, and $d = s \times \tan \gamma$.

8. A height measurement device comprising:
a controller programmed to calculate a dimension of a structure on a sample based on a detection signal acquired by irradiating the sample with a charged particle beam, wherein the controller
calculates a first dimension between a first irradiation mark of the charged particle beam formed in a first height of the sample and a second irradiation mark of the charged particle beam formed in a second height of the sample, and a second dimension between a third irradiation mark of the charged particle beam formed in the first height of the sample and a fourth irradiation mark of the charged particle beam formed in a third height of the sample,
calculates a dimension between the first height and the second height in a direction of the first height based on the first dimension and irradiation angles using the charged particle beam when the first irradiation mark and the second irradiation mark are formed,
calculates a dimension between the first height and the third height in a direction of the second height based on the second dimension and irradiation angles using the charged particle beam when the third irradiation mark and the fourth irradiation mark are formed,
calculates an average value of the dimension in the direction of the first height and the dimension in the direction of the second height, and
wherein the controller calculates a dimension s between a first portion on the sample and a second portion on the sample, and calculates a dimension between the first portion and the second portion based on the dimension s and the following expression:

$d = s/\tan(\alpha)$, where d is a height difference between the first portion and the second portion, and
$\alpha$ is a relative angle between a vertical line of a sample surface and a virtual straight line that connects the first portion and the second portion.

9. A charged particle beam device comprising:
a detector which detects charged particles acquired by irradiating a sample provided in a sample chamber with a charged particle beam emitted from a charged particle source, and a controller programmed to measure a dimension of a structure formed on the sample based on an output of the detector,
wherein the controller calculates a first dimension between a first irradiation mark of the charged particle beam formed in a first height of the sample and a second irradiation mark of the charged particle beam formed in a second height of the sample, and a second dimension between a third irradiation mark of the charged particle beam formed in the first height of the sample and a fourth irradiation mark of the charged particle beam formed in a third height of the sample, and calculates a dimension between the first height and the second height in a direction of the first height based on the first dimension, irradiation angles using the charged particle beam when the first irradiation mark and the second irradiation mark are formed, calculates a dimension between the first height and the third height in a direction of the second height based on the second dimension and irradiation angles using the charged particle beam when the third irradiation mark and the fourth irradiation mark are formed, and calculates an average value of the dimension in the direction of the first height and the dimension in the direction of the second height.

10. The charged particle beam device according to claim 9,
wherein ion beam columns that form the irradiation mark of the first charged particle beam and the irradiation mark of the second charged particle beam are provided in the sample chamber.

11. A height measurement method of measuring a dimension of a structure on a sample in a height direction, the method comprising:
irradiating the sample with an ion beam to form an inclined surface that is inclined with respect to a surface of the sample;
irradiating the sample and the inclined surface with ion beams while inclining the ion beam at an angle of $\alpha$ with respect to a vertical direction of the surface of the sample so as to allow the ion beam to irradiate the surface of the sample and the inclined surface at different positions as seen from the vertical direction, so that a first irradiation mark and a second irradiation mark are formed on the surface of the sample and the inclined surface, respectively;
scanning the sample with a charged particle beam in the vertical direction after the first irradiation mark and the second irradiation mark are formed,
measuring a dimension s between the first irradiation mark and the second irradiation mark based on a detection signal acquired through the scanning, and
calculating a dimension between the first irradiation mark and the second irradiation mark in the height direction based on the dimension s and the angle $\alpha$.

* * * * *